United States Patent
Kwon et al.

(10) Patent No.: US 12,507,497 B2
(45) Date of Patent: Dec. 23, 2025

(54) IMAGE SENSOR

(71) Applicant: Samsung Electronics Co., Ltd., Suwon-si (KR)

(72) Inventors: Doowon Kwon, Seongnam-si (KR); Junghye Kim, Suwon-si (KR); Donghyun Kim, Hwaseong-si (KR); Minho Jang, Busan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 533 days.

(21) Appl. No.: 18/155,868

(22) Filed: Jan. 18, 2023

(65) Prior Publication Data
US 2023/0282669 A1    Sep. 7, 2023

(30) Foreign Application Priority Data
Jan. 28, 2022    (KR) .................. 10-2022-0013622

(51) Int. Cl.
H10F 39/00    (2025.01)
H01L 23/00    (2006.01)

(52) U.S. Cl.
CPC ............ H10F 39/811 (2025.01); H01L 24/08 (2013.01); H01L 24/80 (2013.01); H10F 39/018 (2025.01); H10F 39/809 (2025.01); H01L 2224/08145 (2013.01); H01L 2224/80895 (2013.01); H01L 2224/80896 (2013.01)

(58) Field of Classification Search
CPC . H01L 2224/08145; H01L 2224/80895; H01L 2224/80896; H01L 2224/80894; H10F 39/018; H10F 39/809; H10F 39/18; H10F 39/199
See application file for complete search history.

(56) References Cited

U.S. PATENT DOCUMENTS

| | | |
|---|---|---|
| 9,799,587 B2 | 10/2017 | Fujii et al. |
| 10,163,946 B2 | 12/2018 | Kwon |
| 10,834,347 B2 | 11/2020 | Jung et al. |
| 10,879,293 B2 | 12/2020 | Furuhashi |
| 11,133,343 B2 | 9/2021 | Yamagishi et al. |
| 2020/0135617 A1* | 4/2020 | Shen ................. H10F 39/809 |
| 2021/0104571 A1 | 4/2021 | Shohji et al. |

FOREIGN PATENT DOCUMENTS

| | | |
|---|---|---|
| WO | WO-2020-100806 A1 | 5/2020 |
| WO | WO-2020-262643 A1 | 12/2020 |

* cited by examiner

*Primary Examiner* — Tucker J Wright
(74) *Attorney, Agent, or Firm* — Fish & Richardson P.C.

(57) ABSTRACT

An image sensor includes a first structure and a second structure stacked on the first structure in a vertical direction, the first structure including first and second pixel pads electrically connected to first and second floating diffusion regions, respectively, and a first coupling suppression line penetrating between the first and second pixel pads, and electrically connected to the first ground structure, and the second structure including third and fourth pixel pads electrically connected to first and second source-follower gates, respectively; and a second coupling suppression line penetrating between the third and fourth pixel pads, and electrically connected to the second ground structure.

20 Claims, 9 Drawing Sheets

IMAGE SENSOR

CROSS-REFERENCE TO RELATED APPLICATION

This application is based on and claims priority under 35 U.S.C. § 119 to Korean Patent Application No. 10-2022-0013622, filed on Jan. 28, 2022, in the Korean Intellectual Property Office, the disclosure of which is incorporated by reference herein in its entirety.

BACKGROUND

The inventive concepts relate to image sensors, and more particularly to, complementary metal oxide semiconductor (CMOS) image sensors.

An image sensor is a device that converts an optical image into an electrical signal, and may be used in a camera of a portable electronic device such as a smart phone or a tablet. In order to reduce the size of a portable electronic device and improve the performance of a camera, a stacked image sensor has been developed. The stacked image sensor may achieve reduction of a planar area of the image sensor, improvement of resolution of the image sensor, and improvement of a signal processing speed of the image sensor.

SUMMARY

The inventive concepts provide stacked image sensors that suppresses coupling between neighboring pixel pads.

According to an aspect of the inventive concepts, there is provided an image sensor including a first structure and a second structure stacked on the first structure in a vertical direction, the first structure including a first substrate including a first pixel region and a first ground region surrounding the first pixel region; first and second photoelectric conversion units in the first pixel region; first and second floating diffusion regions in the first pixel region; a first interlayer insulating layer on the first substrate; a first ground structure in a part of the first interlayer insulating layer on the first ground region; first and second pixel pads located on a part of the first interlayer insulating layer of the first pixel region and electrically connected to the first and second floating diffusion regions, respectively; and a first coupling suppression line extending in a first horizontal direction on a part of the first interlayer insulating layer of the first pixel region and the first ground region, penetrating between the first and second pixel pads, and electrically connected to the first ground structure, the second structure including a second substrate including a second pixel region and a second ground region surrounding the second pixel region; first and second source-follower gates on the second pixel region; a second interlayer insulating layer on the second substrate; a second ground structure in a part of the second interlayer insulating layer on the second ground region; third and fourth pixel pads located on a part of the second interlayer insulating layer of the second pixel region and electrically connected to the first and second source-follower gates, respectively; and a second coupling suppression line extending in the first horizontal direction on a part of the second interlayer insulating layer of the second pixel region and the second ground region, penetrating between the third and fourth pixel pads, and electrically connected to the second ground structure, and the first and second pixel pads contact the third and fourth pixel pads, respectively.

According to another aspect of the inventive concepts, there is provided an image sensor including a first substrate including a pixel region and a ground region surrounding the pixel region; first and second photoelectric conversion units in the pixel region; first and second floating diffusion regions in the pixel region; a first interlayer insulating layer on the first substrate; a ground structure in a part of the first interlayer insulating layer on the ground region; first and second pixel pads located on a part of the first interlayer insulating layer of the pixel region and electrically connected to the first and second floating diffusion regions, respectively; a first coupling suppression line extending in a horizontal direction on a part of the first interlayer insulating layer on the pixel region and the ground region, penetrating between the first and second pixel pads, and electrically connected to the ground structure; third and fourth pixel pads contacting the first and second pixel pads, respectively; a second coupling suppression line contacting the first coupling suppression line, extending in the horizontal direction, and penetrating between the third and fourth pixel pads; a second interlayer insulating layer on the third and fourth pixel pads and the second coupling suppression line; first and second source-follower gates located on the second interlayer insulating layer and electrically connected to the third and fourth pixel pads, respectively; and a second substrate on the second interlayer insulating layer.

According to another aspect of the inventive concepts, there is provided an image sensor including a first structure and a second structure stacked on the first structure in a vertical direction, the first structure including a first substrate; first and second photoelectric conversion units in the first substrate; first and second floating diffusion regions in the first substrate; a first interlayer insulating layer on the first substrate; first and second pixel pads located on the first interlayer insulating layer and electrically connected to the first and second floating diffusion regions, respectively; and a first coupling suppression line extending in a first horizontal direction on the first interlayer insulating layer and penetrating between the first and second pixel pads; the second structure including a second substrate including a pixel region and a ground region surrounding the pixel region; first and second source-follower gates on the pixel region; a second interlayer insulating layer on the second substrate; a ground structure in a part of the second interlayer insulating layer on the ground region; third and fourth pixel pads located on a part of the second interlayer insulating layer of the pixel region and electrically connected to the first and second source-follower gates, respectively; and a second coupling suppression line extending in a horizontal direction on a part of the second interlayer insulating layer on the pixel region and the ground region, penetrating between the third and fourth pixel pads, and electrically connected to the ground structure, the first and second pixel pads contact the third and fourth pixel pads, respectively, and the first coupling suppression line contacts the second coupling suppression line.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
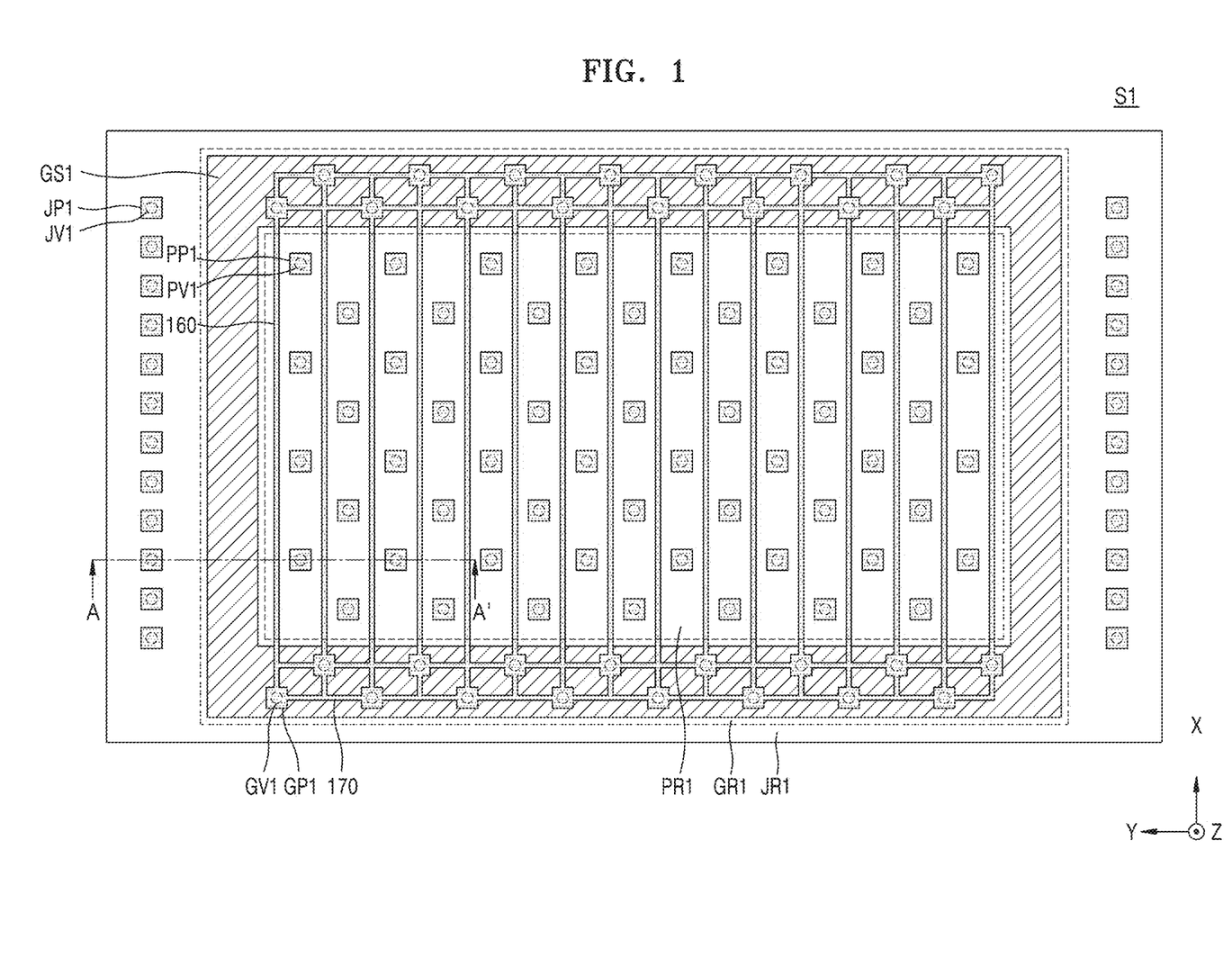
FIG. 1 is a plan view of a first structure included in an image sensor according to some example embodiments of the inventive concepts as viewed in a −Z direction.
Figure 2:
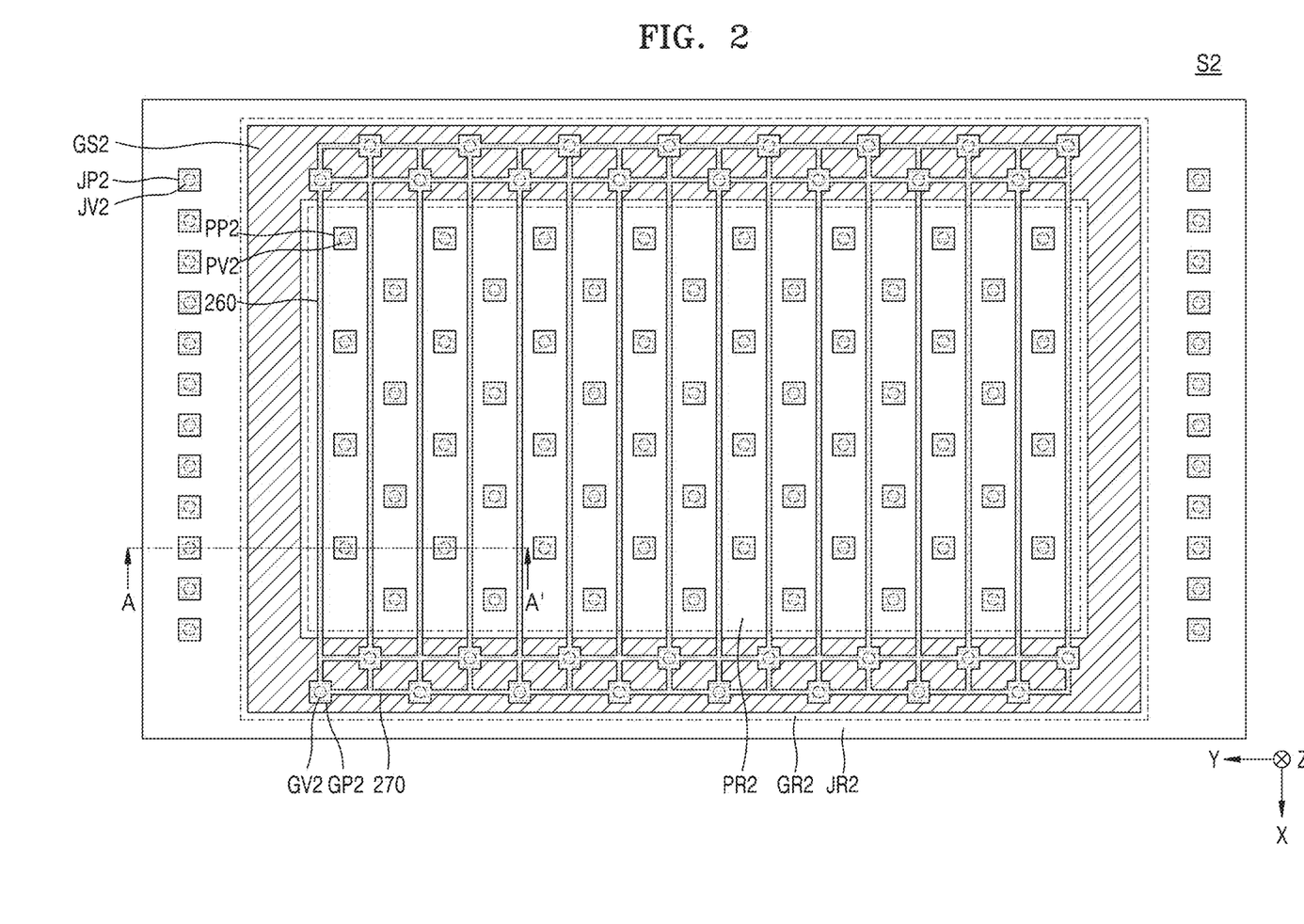
FIG. 2 is a plan view of a second structure included in the image sensor according to some example embodiments of the inventive concepts as viewed in a +Z direction.
Figure 3:
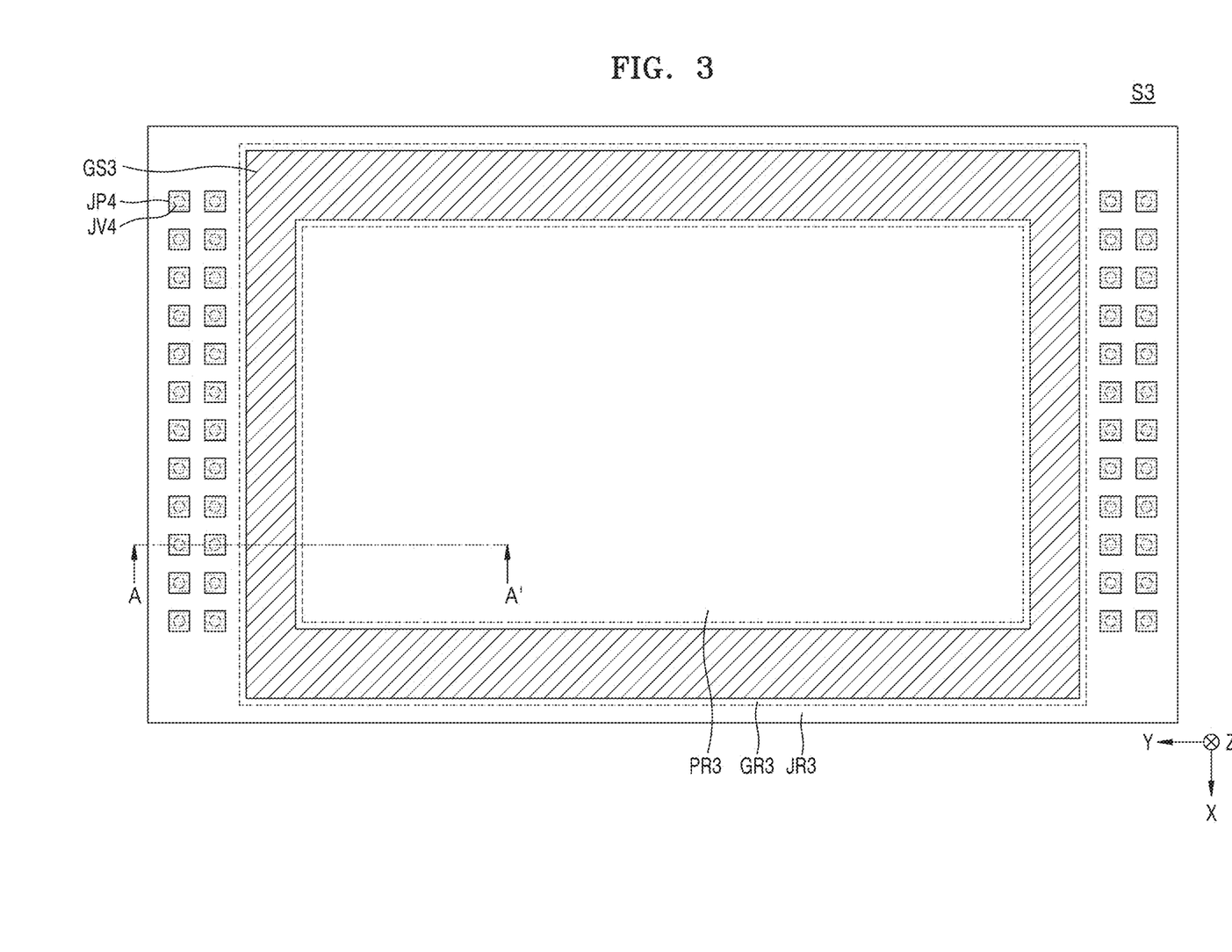
FIG. 3 is a plan view of a third structure included in the image sensor according to some example embodiments of the inventive concepts as viewed in the +Z direction.
Figure 4:
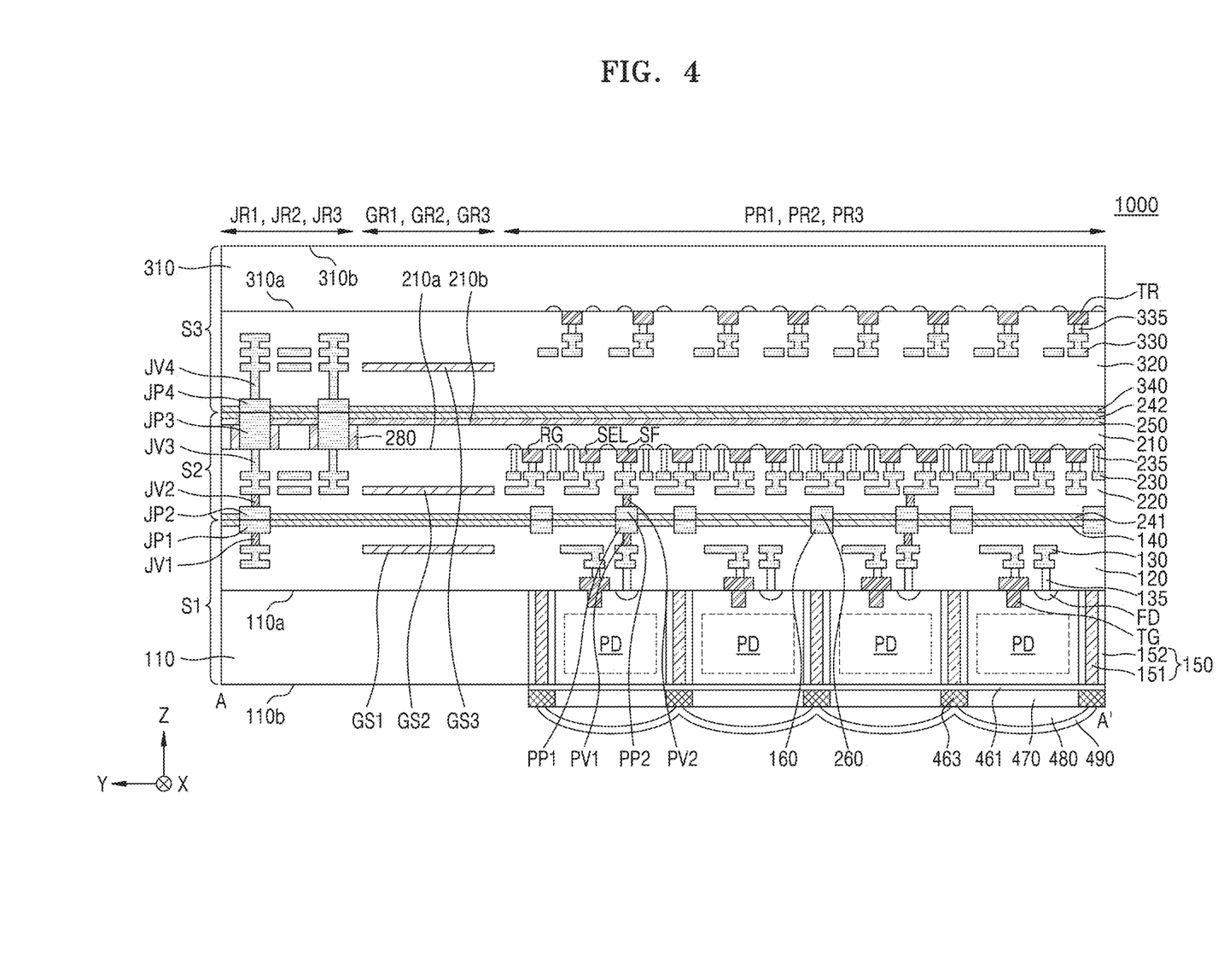
FIG. 4 is a cross-sectional view illustrating the image sensor according to some example embodiments of the inventive concepts taken along line A-A' of FIGS. 1 to 3.
Figure 5:
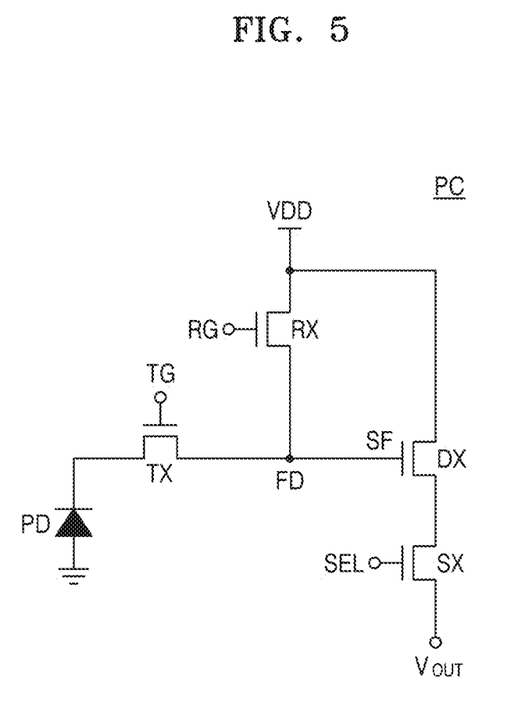
FIG. 5 is a circuit diagram illustrating a pixel circuit included in the image sensor according to some example embodiments of the inventive concepts.

FIG. 1 is a plan view of a first structure S1 included in an image sensor 1000 according to some example embodiments of the inventive concepts as viewed in a −Z direction. FIG. 2 is a plan view of a second structure S2 included in the image sensor 1000 according to some example embodiments of the inventive concepts as viewed in a +Z direction. FIG. 3 is a plan view of a third structure S3 included in the image sensor 1000 according to some example embodiments of the inventive concepts as viewed in the +Z direction. FIG. 4 is a cross-sectional view illustrating the image sensor 1000 according to some example embodiments of the inventive concepts taken along line A-A' of FIGS. 1 to 3. FIG. 5 is a circuit diagram illustrating a pixel circuit PC included in the image sensor 1000 according to some example embodiments of the inventive concepts.

FIGS. 1 to 5, the image sensor 1000 may include the first structure S1, the second structure S2, and the third structure S3 stacked in a vertical direction (Z direction). That is, the image sensor 1000 may include the first structure S1, the second structure S2 on the upper surface of the first structure S1, and the third structure S3 on the upper surface of the second structure S2. In some example embodiments, the image sensor 1000 may further include an antireflection layer 461 on a lower surface of the first structure S1, a fence 463 on the antireflection layer 461, a color filter 470 on the antireflection layer 461, a micro-lens 480 on the color filter 470, and a capping layer 490 on the micro-lens 480.

The first structure S1 may include a first substrate 110. The first substrate 110 may include a first surface 110a and a second surface 110b that face each other (for example, are on opposing sides of the first substrate 110). The first surface 110a and the second surface 110b of the first substrate 110 may be perpendicular to the vertical direction (Z direction). The first substrate 110 may include a semiconductor material such as a group IV semiconductor material, a group III-V semiconductor material, and/or a group II-VI semiconductor material. The group IV semiconductor material may include, for example, silicon (Si), germanium (Ge), or silicon (Si)-germanium (Ge). The III-V semiconductor material may include, for example, gallium arsenide (GaAs), indium phosphate (InP), gallium phosphate (GaP), indium arsenide (InAs), indium antimony (InSb), and/or indium gallium arsenide (InGaAs). The II-VI semiconductor material may include, for example, zinc telluride (ZnTe) and/or cadmium sulfide (CdS).

The first substrate 110 may include a first pixel region PR1, a first ground region GR1, and a first peripheral region JR1. As shown in FIG. 1, in a plan view, the first ground region GR1 may surround the first pixel region PR1, and the first peripheral region JR1 may surround the first ground region GR1.

The first structure S1 may further include a plurality of photoelectric conversion units PD in the first pixel region PR1. The photoelectric conversion unit PD may include a photodiode. In this case, the photoelectric conversion unit PD may include an impurity region having a conductivity type opposite to that of the first substrate 110. In some example embodiments, the photoelectric conversion region PD may include a photo transistor, a photo gate, or a pinned photo diode.

The first structure S1 may further include a pixel separation structure 150. The pixel separation structure 150 may electrically separate the plurality of photoelectric conversion units PD from each other. The pixel separation structure 150 may completely penetrate the first substrate 110 in the −Z direction from the first surface 110a to the second surface 110b of the first substrate 110. In some example embodiments, unlike shown in FIG. 4, the pixel separation structure 150 may not completely penetrate the first substrate 110.

The pixel separation structure 150 may include a pixel separation conductive layer 151 and a pixel separation insulating layer 152. In some example embodiments, each of the pixel separation conductive layer 151 and the pixel separation insulating layer 152 may completely penetrate the first substrate 110 from the first surface 110a to the second surface 110b of the first substrate 110. In some example embodiments, each of the pixel separation conductive layer 151 and the pixel separation insulating layer 152 may not completely penetrate the first substrate 110. The pixel separation insulating layer 152 may be disposed between the pixel separation conductive layer 151 and the first substrate 110 to electrically separate the pixel separation conductive layer 151 from the first substrate 110.

In some example embodiments, the pixel separation conductive layer 151 may include a conductive material such as polysilicon or metal. In some example embodiments, the pixel separation insulating layer 152 may include metal oxide such as hafnium oxide, aluminum oxide, or tantalum oxide. In this case, the pixel separation insulating layer 152 may act as a negative fixed charge layer. In some example embodiments, the pixel separation insulating layer 152 may include another insulating material such as silicon oxide, silicon nitride, silicon oxynitride, or a combination thereof.

The first structure S1 may further include a plurality of floating diffusion regions FD in the first pixel region PR1. The plurality of floating diffusion regions FD may be disposed in the first substrate 110 to be adjacent to the first surface 110a of the first substrate 110. Each floating diffusion region FD may be an impurity region in the first substrate 110.

The first structure S1 may further include a plurality of transfer gates TG on the first pixel region PR1. In some example embodiments, each transfer gate TG may be recessed into the first substrate 110 from the first surface 110a of the first substrate 110. In some example embodiments, unlike illustrated in FIG. 4, the transfer gate TG may not be recessed into the first substrate 110. As shown in FIG. 5, the transfer gate TG may be included in s transfer transistor TX.

The first structure S1 may further include a first interlayer insulating layer 120. The first interlayer insulating layer 120 may cover the first surface 110a of the first substrate 110 and the plurality of transfer gates TG. The first interlayer insulating layer 120 may have a multilayer structure. The first interlayer insulating layer 120 may include, for example, silicon oxide, silicon nitride, or a combination thereof. In some example embodiments, the first interlayer insulating layer 120 may include a low-k material having a dielectric constant smaller than that of silicon oxide.

The first structure S1 may further include a first bonding layer 140 on the first interlayer insulating layer 120. The first bonding layer 140 may include, for example, silicon oxide (SiO$_2$), silicon nitride (SiN), silicon oxynitride (SiON), silicon carbonitride (SiCN), silicon oxycarbide (SiOC), or a combination thereof.

The first structure S1 may further include a first ground structure GS1. The first ground structure GS1 may be located in a part of the first interlayer insulating layer 120 on the first ground region GR1. The first ground structure GS1 may be grounded. The first ground structure GS1 may include a conductive material such as copper (Cu), tungsten (W), aluminum (Al), silver (Ag), gold (Au), or a combination thereof. In the plan view of FIG. 1, the first ground structure GS1 may surround a part of the first interlayer insulating layer 120 on the first pixel region PR1. In the plan view of FIG. 1, the first ground structure GS1 may have a ring shape, for example, a quadrangular ring shape.

The first structure S1 may further include a plurality of first pixel pads PP1. The plurality of first pixel pads PP1 may be located on parts of the first interlayer insulating layer 120 and the first bonding layer 140 on the first pixel region PR1. The plurality of first pixel pads PP1 may be electrically connected to a plurality of floating diffusion regions FD, respectively. The plurality of first pixel pads PP1 may include a conductive material such as copper (Cu).

The first structure S1 may further include a first coupling suppression line 160. The first coupling suppression line 160 may extend in a first horizontal direction (X direction) on a part of the first interlayer insulating layer 120 on the first pixel region PR1 and the first ground region GR1 and penetrate between the plurality of first pixel pads PP1. The first coupling suppression line 160 may be electrically connected to the first ground structure GS1. The first coupling suppression line 160 may suppress coupling between the adjacent first pixel pads PP1. The first coupling suppression line 160 may include, for example, a conductive material such as copper (Cu). In some example embodiments, the first coupling suppression line 160 may include, for example, the same material as that of the first pixel pad PP1. In some example embodiments, a surface of the first coupling suppression line 160 in contact with the second coupling suppression line 260 and a surface of the first pixel pad PP1 in contact with the second pixel pad PP2 may be coplanar. In some example embodiments, there may be a plurality of first coupling suppression lines 160 spaced apart in the second horizontal direction (Y direction), separating first pixel pads PP1 which are adjacent in the second horizontal direction.

As shown in FIG. 1, the first structure S1 may further include a first ground line 170. The first ground line 170 may extend in a second horizontal direction (Y direction) on a part of the first interlayer insulating layer 120 of the first ground region GR1 to intersect the first coupling suppression line 160. In some example embodiments, the second horizontal direction (Y direction) may be perpendicular to the first horizontal direction (X direction). The first ground line 170 may be electrically connected to the first ground structure GS1. The first ground line 170 may include, for example, a conductive material such as copper (Cu). In some example embodiments, the first ground line 170 may include the same material as that of the first coupling suppression line 160.

As shown in FIG. 1, the first structure S1 may further include a first ground pad GP1 located at the intersection of the first ground line 170 and the first coupling suppression line 160. The first ground pad GP1 may be electrically connected to the first ground structure GS1. The first ground pad GP1 may include, for example, a conductive material such as copper (Cu). In some example embodiments, the first ground pad GP1 may include the same material as those of the first ground line 170 and the first coupling suppression line 160.

The first structure S1 may further include a first ground via GV1 extending in the vertical direction (Z direction) between the first ground pad GP1 and the first ground structure GS1. The first ground via GV1 may electrically connect the first ground pad GP1 to the first ground structure GS1. The first ground via GV1 may be located in a part of the first interlayer insulating layer 120 of the first ground region GR1 and electrically connect the first coupling suppression line 160 to the first ground structure GS1. In some example embodiments, the first ground via GV1 may include the same material, for example, copper (Cu), as that of the first ground pad GP1. In some example embodiments, the first ground via VP1 may include a material different from that of the first ground pad GP1. For example, the first ground via GV1 may include tungsten (W) and the first ground pad GP1 may include copper (Cu).

The first structure S1 may further include a plurality of first peripheral pads JP1 on parts of the first interlayer insulating layer 120 and the first bonding layer 140 of the first peripheral region JR1. The plurality of first peripheral pads JP1 may include, for example, a conductive material such as copper (Cu). In some example embodiments, the plurality of first peripheral pads JP1 may include the same material as that of the plurality of first pixel pads PP1.

The first structure S1 may further include a first connection structure 130 in the first interlayer insulating layer 120. The first connection structure 130 may electrically connect the floating diffusion region FD to the first pixel pad PP1 and electrically connect the transfer gate TG to the first peripheral pad JP1. The first connection structure 130 may include a plurality of conductive lines and a plurality of conductive vias. The plurality of conductive lines and the plurality of conductive vias may include copper (Cu), aluminum (Al), silver (Ag), gold (Au), titanium (Ti), tungsten (W), or a combination thereof.

The first structure S1 may further include a plurality of first pixel vias PV1. The plurality of first pixel vias PV1 may electrically connect the plurality of first pixel pads PP1 to the plurality of floating diffusion regions FD, respectively. For example, the plurality of first pixel vias PV1 may electrically connect the plurality of first pixel pads PP1 to the plurality of floating diffusion regions FD respectively through the first connection structure 130. In some example embodiments, the plurality of first pixel vias PV1 may include the same material, for example, copper (Cu), as that of the plurality of first pixel pads PP1. In some example embodiments, the plurality of first pixel vias PV1 may include a material different from that of the plurality of first pixel pads PP1. For example, the plurality of first pixel vias PV1 may include tungsten (W), and the plurality of first pixel pads PP1 may include copper (Cu).

The first structure S1 may further include a plurality of first contacts 135. The plurality of first contacts 135 may electrically connect the plurality of transfer gates TG and the plurality of floating diffusion regions FD to the first connection structure 130. The plurality of first contacts 135 may include, for example, a conductive material such as tungsten (W).

The first structure S1 may further include a plurality of first peripheral vias JV1. The plurality of first peripheral vias JV1 may electrically connect the plurality of first peripheral pads JP1 to the first connection structure 130. In some example embodiments, the plurality of first peripheral vias JV1 may include the same material, for example, copper (Cu), as that of the plurality of first peripheral pads JP1. In some example embodiments, the plurality of first peripheral vias JV1 may include a material different from that of the plurality of first peripheral pads JP1. For example, the plurality of first peripheral vias JV1 may include tungsten (W), and the plurality of first peripheral pads JP1 may include copper (Cu).

The second structure S2 may include a second substrate 210. The second substrate 210 may include a first surface 210a and a second surface 210b that face each other. The first surface 210a and the second surface 210b of the second substrate 210 may be perpendicular to the vertical direction (Z direction). The second substrate 210 may include a semiconductor material such as a group IV semiconductor material, a group III-V semiconductor material, or a group II-VI semiconductor material. The second substrate 210 may include a second pixel region PR2, a second ground region GR2, and a second peripheral region JR2. As shown in FIG. 2, in a plan view, the second ground region GR2 may surround the second pixel region PR2, and the second peripheral region JR2 may surround the second ground region GR2.

The second structure S2 may further include a plurality of source-follower gates SF, a plurality of select gates SEL, and a plurality of reset gates RG on the second pixel region PR2. As shown in FIG. 5, each source-follower gate SF may be included in a source-follower transistor DX, each select gate SEL may be included in a select transistor SX, and each reset gate RG may be included in a reset transistor RX. As shown in FIG. 5, the photoelectric conversion unit PD, the transfer transistor TX, the floating diffusion region FD, the reset transistor RX, the source-follower transistor DX, and the select transistor SX may form the pixel circuit PC.

The photoelectric conversion unit PD may generate electric charges, for example, electrons and holes, according to the amount of incident light. The transfer gate TG may transfer the charges generated by the photoelectric conversion unit PD to the floating diffusion region FD. The transfer gate TG may be a gate of the transfer transistor TX. The floating diffusion region FD may accumulate charges.

The source-follower transistor DX may generate a source-drain current according to the amount of photocharges accumulated in the floating diffusion region FD. The source-follower transistor DX may amplify a potential change in the floating diffusion region FD as a buffer amplifier and output an amplified signal to an output line Vout through the select transistor SX. The source-follower transistor DX may include a source-follower gate SF. The source-follower gate SF may be connected to the floating diffusion region FD, a drain of the source-follower transistor DX may be connected to a power supply voltage VDD, and a source of the source-follower transistor DX may be connected to a drain of the select transistor SX.

The reset transistor RX may periodically reset the charges accumulated in the floating diffusion region FD. The reset transistor RX may include a reset gate RG. A drain electrode of the reset transistor RX is connected to the floating diffusion region FD, and a source electrode of the reset transistor RX is connected to the power supply voltage VDD. When the reset transistor RX is turned on, the power voltage VDD connected to the source electrode of the reset transistor RX is transferred to the floating diffusion region FD. When the reset transistor RX is turned on, the charges accumulated in the floating diffusion region FD may be discharged to reset the floating diffusion region FD.

The select transistor SX is a transistor serving as a switch and may be used to select the plurality of pixel circuits PC in a row unit. The select transistor SX may include the select gate SEL. When the select transistor SX is turned on, the power supply voltage VDD connected to the drain electrode of the source follower transistor DX may be transferred to the drain electrode of the select transistor SX.

The second structure S2 may further include a second interlayer insulating layer 220. The second interlayer insulating layer 220 may cover the first surface 210a of the second substrate 210, the plurality of reset gates RG, the plurality of select gates SEL, and the plurality of source-follower gates SF. The second interlayer insulating layer 220 may have a multilayer structure. The second interlayer insulating layer 220 may include, for example, silicon oxide, silicon nitride, or a combination thereof. In some example embodiments, the second interlayer insulating layer 220 may include a low-k material having a dielectric constant smaller than that of silicon oxide.

The second structure S2 may further include a second bonding layer 241 on the second interlayer insulating layer 220. The second bonding layer 241 may include, for example, silicon oxide (SiO$_2$), silicon nitride (SiN), silicon oxynitride (SiON), silicon carbonitride (SiCN), silicon oxycarbide (SiOC), or a combination thereof. In some example embodiments, the first bonding layer 140 may be in contact with the second bonding layer 241. In some example embodiments in which the first bonding layer 140 and the second bonding layer 241 include the same material, a boundary between the first bonding layer 140 and the second bonding layer 241 may be unclear.

The second structure S2 may further include a second ground structure GS2. The second ground structure GS2 may be located in a part of the second interlayer insulating layer 220 on the second ground region GR2. The second ground structure GS2 may be grounded. The second ground structure GS2 may include a conductive material such as copper (Cu), tungsten (W), aluminum (Al), silver (Ag), gold (Au), or a combination thereof. In the plan view of FIG. 2, the second ground structure GS2 may surround a part of the second interlayer insulating layer 220 on the second pixel region PR2. In the plan view of FIG. 2, the second ground structure GS2 may have a ring shape, for example, a quadrangular ring shape.

The second structure S2 may further include a plurality of second pixel pads PP2. The plurality of second pixel pads PP2 may be located on parts of the second interlayer insulating layer 220 and the second bonding layer 241 on the second pixel region PR2. The plurality of second pixel pads PP2 may be electrically connected to the plurality of source-follower gates SF, respectively. The plurality of second pixel pads PP2 may include a conductive material such as copper (Cu). The plurality of second pixel pads PP2 may respectively contact the plurality of first pixel pads PP1. For example, Cu—Cu bonding may be respectively formed between the plurality of second pixel pads PP2 and the plurality of first pixel pads PP1.

The second structure S2 may further include a second coupling suppression line 260. The second coupling suppression line 260 may extend in the first horizontal direction (X direction) on a part of the second interlayer insulating layer 220 of the second pixel region PR2 and the second ground region GR2 and penetrate between the plurality of second pixel pads PP2. The second coupling suppression line 260 may be electrically connected to the second ground structure GS2. The second coupling suppression line 260 may suppress coupling between the adjacent second pixel pads PP2. The second coupling suppression line 260 may include, for example, a conductive material such as copper (Cu). In some example embodiments, the second coupling suppression line 260 may include, for example, the same material as that of the second pixel pad PP2. In some example embodiments, the first coupling suppression line 160 and the second coupling suppression line 260 may contact. For example, Cu—Cu bonding may be formed between the first coupling suppression line 160 and the second coupling suppression line 260. In some example embodiments, a surface of the second coupling suppression line 260 in contact with the first coupling suppression line 160 and a surface of the second pixel pad PP2 in contact with the first pixel pad PP1 may be coplanar. In some example embodiments, there may be a plurality of second coupling suppression lines 260 spaced apart in the second horizontal direction (Y direction), separating second pixel pads PP2 which are adjacent in the second horizontal direction.

The second structure S2 may further include a second ground line 270. The second ground line 270 may extend in the second horizontal direction (Y direction) on the part of the second interlayer insulating layer 220 of the second ground region GR2 to intersect the second coupling suppression line 260. In some example embodiments, the second horizontal direction (Y direction) may be perpendicular to the first horizontal direction (X direction). The second ground line 270 may be electrically connected to the second ground structure GS2. The second ground line 270 may include, for example, a conductive material such as copper (Cu). In some example embodiments, the second ground line 270 may include the same material as that of the second coupling suppression line 260. In some example embodiments, the second ground line 270 may contact the first ground line 170. For example, Cu—Cu bonding may be formed between the second ground line 270 and the first ground line 170.

As shown in FIG. 2, the second structure S2 may further include a second ground pad GP2 located at the intersection of the second ground line 270 and the second coupling suppression line 260. The second ground pad GP2 may be electrically connected to the second ground structure GS2. The second ground pad GP2 may include, for example, a conductive material such as copper (Cu). In some example embodiments, the second ground pad GP2 may include the same material as those of the second ground line 270 and the second coupling suppression line 260. In some example embodiments, the first ground pad GP1 may contact the second ground pad GP2. For example, Cu—Cu bonding may be formed between the first ground pad GP1 and the second ground pad GP2.

The second structure S2 may further include a second ground via GV2 extending in the vertical direction (Z direction) between the second ground pad GP2 and the second ground structure GS2. The second ground via GV2 may electrically connect the second ground pad GP2 to the second ground structure GS2. The second ground via GV2 may be located in a part of the second interlayer insulating layer 220 on the second ground region GR2 and may electrically connect the second coupling suppression line 260 to the second ground structure GS2. In some example embodiments, the second ground via GV2 may include the same material, for example, copper (Cu), as that of the second ground pad GP2. In some example embodiments, the second ground via GV2 may include a material different from that of the second ground pad GP2. For example, the second ground via GV2 may include tungsten (W) and the second ground pad GP2 may include copper (Cu).

The second structure S2 may further include a plurality of second peripheral pads JP2 on parts of the second interlayer insulating layer 220 and the second bonding layer 241 of the second peripheral region JR2. The plurality of second peripheral pads JP2 may include, for example, a conductive material such as copper (Cu). In some example embodiments, the plurality of second peripheral pads JP2 may include the same material as that of the plurality of second pixel pads PP2. In some example embodiments, the plurality of second peripheral pads JP2 may respectively contact the plurality of first peripheral pads JP1. For example, Cu—Cu bonding may be formed between the plurality of second peripheral pads JP2 and the plurality of first peripheral pads JP1.

The second structure S2 may further include a second connection structure 230 in the second interlayer insulating layer 220. The second connection structure 230 may electrically connect the source follower gate SF to the second pixel pad PP2, and may be electrically connected to the select gate SEL, the reset gate RG, the second peripheral pad JP2, and the third peripheral pad JP3. The second connection structure 230 may include a plurality of conductive lines and a plurality of conductive vias. The plurality of conductive lines and the plurality of conductive vias may include copper (Cu), aluminum (Al), silver (Ag), gold (Au), titanium (Ti), tungsten (W), or a combination thereof.

The second structure S2 may further include a plurality of second pixel vias PV2. The plurality of second pixel vias PV2 may electrically connect the plurality of second pixel pads PP2 to the plurality of source-follower gates SF, respectively. For example, the plurality of second pixel vias PV2 may electrically connect the plurality of second pixel pads PP2 to the plurality of source-follower gates SF respectively through the second connection structure 230. In some example embodiments, the plurality of second pixel vias PV2 may include the same material, for example, copper (Cu), as that of the plurality of second pixel pads PP2. In some example embodiments, the plurality of second pixel vias PV2 may include a material different from that of the plurality of second pixel pads PP2. For example, the plurality of second pixel vias PV2 may include tungsten (W), and the plurality of second pixel pads PP2 may include copper (Cu).

The second structure S2 may further include a plurality of second contacts 235. The plurality of second contacts 235 may electrically connect the plurality of source-follower gates SF, the plurality of select gates SEL, and the plurality of reset gates RG to the second connection structure 230. The plurality of second contacts 235 may include, for example, a conductive material such as tungsten (W).

The second structure S2 may further include a plurality of second peripheral vias JV2. The plurality of second peripheral vias JV2 may electrically connect the plurality of second peripheral pads JP2 to the second connection structure 230. In some example embodiments, the plurality of second peripheral vias JV2 may include the same material, for example, copper (Cu), as that of the plurality of second peripheral pads JP2. In some example embodiments, the plurality of second peripheral vias JV2 may include a material different from that of the plurality of second peripheral pads JP2. For example, the plurality of second peripheral vias JV2 may include tungsten (W), and the plurality of second peripheral pads JP2 may include copper (Cu).

The second structure S2 may further include a bonding insulating layer 250 on the second surface 210b of the second substrate 210. The bonding insulating layer 250 may include, for example, silicon oxide, silicon nitride, or a combination thereof.

The second structure S2 may further include a third bonding layer 242 on the bonding insulating layer 250. The third bonding layer 242 may include, for example, silicon oxide ($SiO_2$), silicon nitride (SiN), silicon oxynitride (SiON), silicon carbonitride (SiCN), silicon oxycarbide (SiOC), or a combination thereof.

The second structure S2 may further include a plurality of third peripheral pads JP3. Each of the third peripheral pads JP3 may penetrate in the vertical direction (Z direction) the second peripheral region JR2 of the second substrate 210, a part of the bonding insulating layer 250 on the second peripheral region JR2, and the third bonding layer 242 on the second peripheral region JR2. The plurality of third peripheral pads JP3 may include, for example, copper (Cu).

The second structure S2 may further include a plurality of third peripheral vias JV3 electrically connecting the plurality of third peripheral pads JP3 to the second connection structure 230. The plurality of third peripheral vias JV3 may be located in a part of the second interlayer insulating layer 220 on the second peripheral region JR2. In some example embodiments, the plurality of third peripheral vias JV3 may include the same material, for example, copper (Cu), as that of the plurality of third peripheral pads JP3. In some example embodiments, the plurality of third peripheral vias JV3 may include a material different from that of the plurality of third peripheral pads JP3. For example, the plurality of third peripheral vias JV3 may include tungsten (W), and the plurality of third peripheral pads JP3 may include copper (Cu).

The second structure S2 may further include a plurality of substrate insulating layers 280. The substrate insulating layer 280 may be located between the second substrate 210 and the third peripheral pad JP3. The substrate insulating layer 280 may electrically separate the third peripheral pad JP3 from the second substrate 210. The substrate insulating layer 280 may include silicon oxide, silicon nitride, or a combination thereof.

The third structure S3 may include a third substrate 310. The third substrate 310 may include a first surface 310a and a second surface 310b that face each other. The first surface 310a and the second surface 310b of the third substrate 310 may be perpendicular to the vertical direction (Z direction). The third substrate 310 may include a semiconductor material such as a group IV semiconductor material, a group III-V semiconductor material, or a group II-VI semiconductor material. The third substrate 310 may include a third pixel region PR3, a third ground region GR3, and a third peripheral region JR3. As shown in FIG. 3, in a plan view, the third ground region GR3 may surround the third pixel region PR3, and the third peripheral region JR3 may surround the third ground region GR3.

The third structure S3 may further include a plurality of transistors TR on the third pixel region PR3. The plurality of transistors TR may form a logic circuit. The logic circuit may include at least one of a row decoder, a row driver, a column decoder, a timing generator, a correlated double sampler (CDS), an analog to digital converter, and an I/O buffer.

The third structure S3 may further include a third interlayer insulating layer 320. The third interlayer insulating layer 320 may cover the first surface 310a of the third substrate 310 and the plurality of transistors TR. The third interlayer insulating layer 320 may have a multilayer structure. The third interlayer insulating layer 320 may include, for example, silicon oxide, silicon nitride, or a combination thereof. In some example embodiments, the third interlayer insulating layer 320 may include a low-k material having a dielectric constant smaller than that of silicon oxide.

The third structure S3 may further include a fourth bonding layer 340 on the third interlayer insulating layer 320. The fourth bonding layer 340 may include, for example, silicon oxide ($SiO_2$), silicon nitride (SiN), silicon oxynitride (SiON), silicon carbonitride (SiCN), silicon oxycarbide (SiOC), or a combination thereof. In some example embodiments, the fourth bonding layer 340 may be in contact with the third bonding layer 242. In some example embodiments in which the third bonding layer 242 and the fourth bonding layer 340 include the same material, the boundary between the third bonding layer 242 and the fourth bonding layer 340 may be unclear.

The third structure S3 may further include a third ground structure GS3. The third ground structure GS3 may be located in a part of the third interlayer insulating layer 320 on the third ground region GR3. The third ground structure GS3 may be grounded. The third ground structure GS3 may include a conductive material such as copper (Cu), tungsten (W), aluminum (Al), silver (Ag), gold (Au), or a combination thereof. In the plan view of FIG. 3, the third ground structure GS3 may surround a part of the third interlayer insulating layer 320 on the third pixel region PR3. In the plan view of FIG. 3, the third ground structure GS3 may have a ring shape, for example, a quadrangular ring shape.

The third structure S3 may further include a third interlayer insulating layer 320 on the third peripheral region JR3 and a plurality of fourth peripheral pads JP4 on parts of the third bonding layer 341. The plurality of fourth peripheral pads JP4 may include, for example, a conductive material such as copper (Cu). In some example embodiments, the plurality of fourth peripheral pads JP4 may respectively contact the plurality of third peripheral pads JP3. For example, Cu—Cu bonding may be formed between the plurality of fourth peripheral pads JP4 and the plurality of third peripheral pads JP3.

The third structure S3 may further include a third connection structure 330 in the third interlayer insulating layer 320. The third connection structure 330 may electrically connect the plurality of transistors TR to the fourth peripheral pad JP4. The third connection structure 330 may include a plurality of conductive lines and a plurality of conductive vias. The plurality of conductive lines and the plurality of conductive vias may include copper (Cu), aluminum (Al), silver (Ag), gold (Au), titanium (Ti), tungsten (W), or a combination thereof.

The third structure S3 may further include a plurality of third contacts 335. The plurality of third contacts 335 may electrically connect the plurality of transistors TR to the third connection structure 330. The plurality of third contacts 335 may include, for example, a conductive material such as tungsten (W).

The third structure S3 may further include a plurality of fourth peripheral vias JV4. The plurality of fourth peripheral vias JV4 may electrically connect the plurality of fourth peripheral pads JP4 to the third connection structure 330. In some example embodiments, the plurality of fourth peripheral vias JV4 may include the same material, for example, copper (Cu), as that of the plurality of fourth peripheral pads JP4. In some example embodiments, the plurality of fourth peripheral vias JV4 may include a material different from that of the plurality of fourth peripheral pads JP4. For example, the plurality of fourth peripheral vias JV4 may include tungsten (W), and the plurality of fourth peripheral pads JP4 may include copper (Cu).

The antireflection layer 461 may be disposed on the second surface 110b of the first substrate 110. The antireflection layer 461 may include, for example, hafnium oxide ($HfO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($H_{02}O_3$), thulium oxide ($Tm_2O_3$), ytterbium oxide ($Yb_2O_3$), lutetium oxide ($Lu_2O_3$), yttrium oxide ($Y_2O_3$), or a combination thereof.

The fence 463 may be disposed on the antireflection layer 461. The fence 463 may be aligned with the pixel separation structure 150 in the vertical direction (Z direction). The fence 463 may include a metal or a low refractive index material. For example, the low refractive index material may include polymethylmetacrylate (PMMA), silicon acrylate, cellulose acetate butyrate (CAB), silica, or fluoro-silicon acrylate (FSA). For example, the low refractive index material may include a polymer material in which silica (SiOx) particles are dispersed.

The color filter 470 may be disposed on the antireflection layer 461 and surrounded by the fence 463. The plurality of color filters 470 may include, for example, a green filter, a blue filter, and a red filter. In some example embodiments, the plurality of color filters 470 may include, for example, a cyan filter, a magenta filter, and a yellow filter. In some example embodiments, the plurality of color filters 470 may have a different selection of color filters.

The micro-lens 480 may be disposed on the color filter 470. The micro-lens 480 may collect incident light, and the collected light may be incident on the photoelectric conversion unit PD through the color filter 470. One micro-lens 480 may be disposed to correspond to one photoelectric conversion unit PD. The micro-lens 480 may include, for example, a styrene-based resin, an acrylic resin, a styrene-acrylic copolymer-based resin, a siloxane-based resin, or a combination thereof. A capping layer 490 may be disposed on the micro-lens 480.

In some example embodiments, the second structure S2 may not include the second ground structure GS2, the second ground line 270, the second ground pad GP2, and the second ground via GV2. In this case, the second coupling suppression line 260 includes the first coupling suppression line 160, the first ground line 170, the first ground pad GP1, the first ground via GV1, and the first It may be grounded through the ground structure GS1.

In some example embodiments, the first structure S1 may not include the first ground line 170, the first ground pad GP1, the first ground via GV1, and the first ground structure GS1. In this case, the first coupling suppression line 160 may be grounded through the second coupling suppression line 260, the second ground line 270, the second ground pad GP2, the second ground via GV2, and the second the ground structure GS2.

FIGS. 6A to 6D are cross-sectional views illustrating a method of manufacturing the image sensor 100 according to some example embodiments of the inventive concepts. In some example embodiments, the cross-sectional views of FIGS. 6A-6D may correspond to line A-A' in FIG. 1.

Figure 6A:
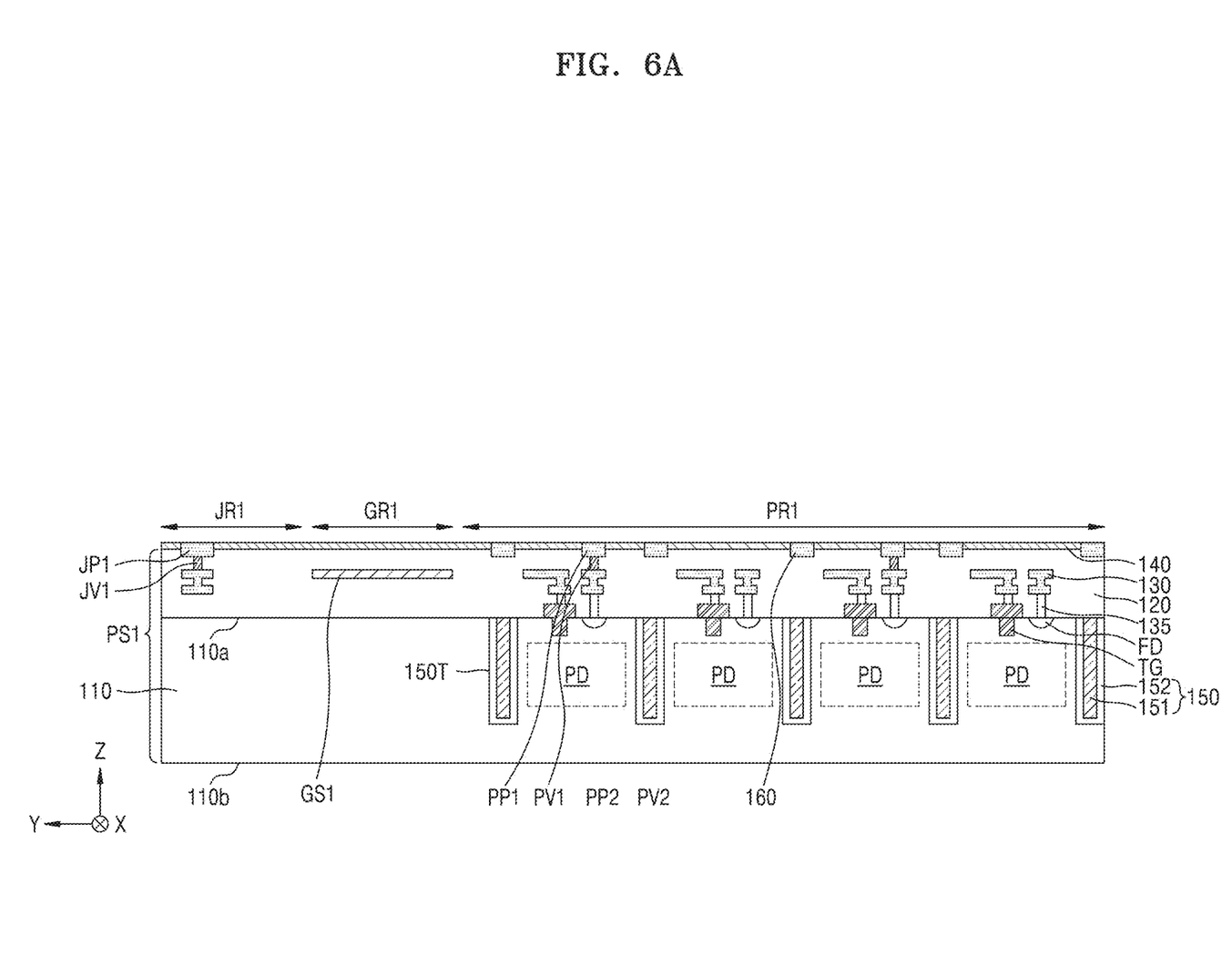
FIGS. 6A to 6D are cross-sectional views illustrating a method of manufacturing an image sensor according to some example embodiments of the inventive concepts.

Referring to FIG. 6A, a first preliminary structure PS1 is prepared. First, the first substrate 110 having the first surface 110a and the second surface 110b may be prepared. A trench 150T may be formed by removing a part of the first substrate 110 from the first surface 110a of the first substrate 110. Thereafter, the pixel separation insulating layer 152 and the pixel separation conductive layer 151 may be formed on the first surface 110a of the first substrate 110 and the trench 150T. Next, the pixel separation structure 150 may be formed in the trench 150T by removing, i.e., polishing, parts of a pixel separation insulating layer 162 and a pixel separation conductive layer 161 on the first surface 110a of the first substrate 110. In addition, the photoelectric conversion unit PD and the floating diffusion region FD may be formed in the first substrate 110 by an ion implantation process from the first surface 110a of the first substrate 110. Next, the plurality of transfer gates TG may be formed on the first surface 110a of the first substrate 110. Next, the plurality of first contacts 135, the first connection structure 130, the first ground structure GS1, the plurality of first pixel vias PV1, the plurality of first peripheral vias JV1, the plurality of first pixel pads PP1, the plurality of first coupling suppression lines 160, the plurality of first peripheral pads JP1, the first interlayer insulating layer 120, and the first bonding layer 140 may be formed. Accordingly, the first preliminary structure PS1 may be completed.

Figure 6B:
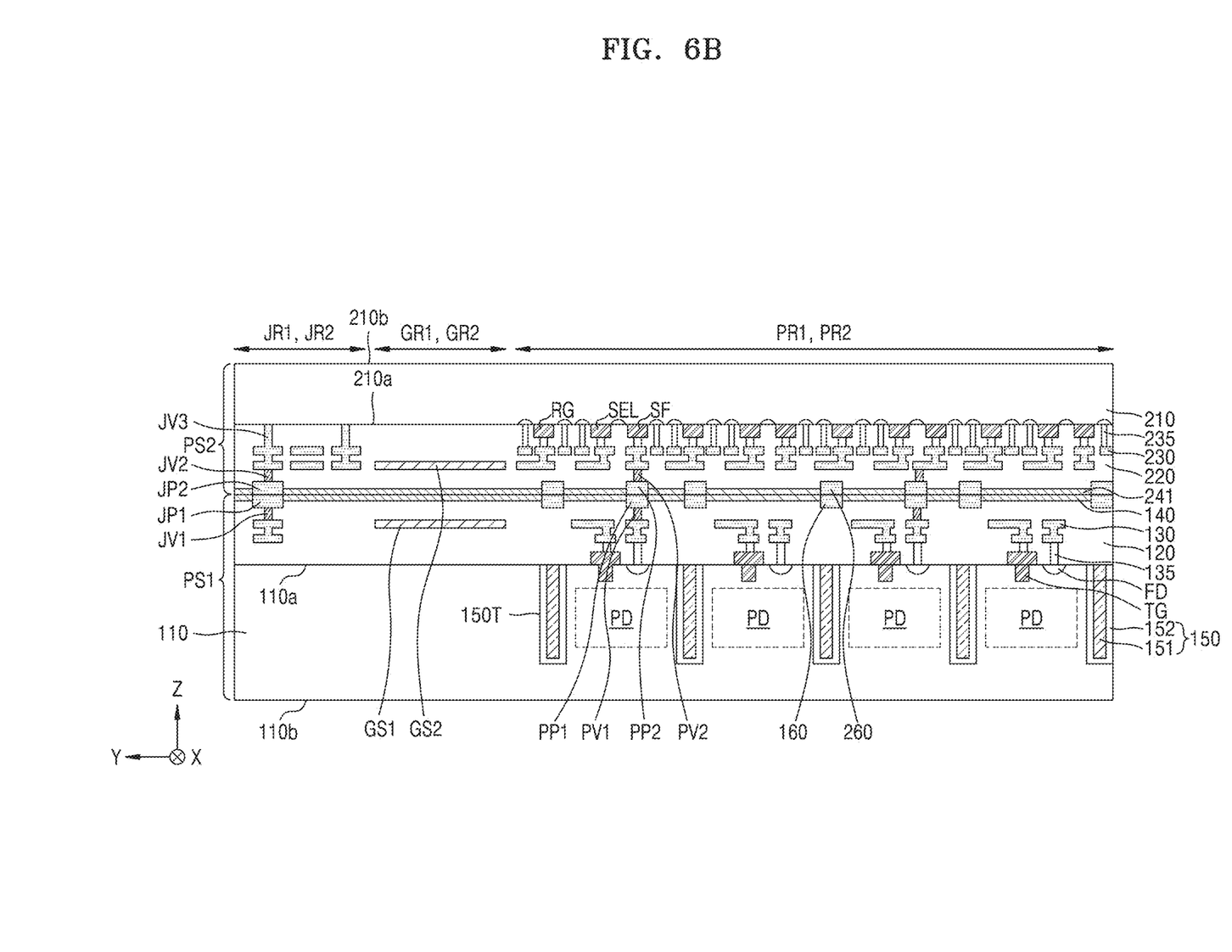

Referring to FIG. 6B, a second preliminary structure PS2 is prepared. First, the second substrate 210 having the first surface 210a and the second surface 210b is prepared. The plurality of reset gates RG, the plurality of select gates SEL, and the plurality of source-follower gates SF may be formed on the first surface 210a of the second substrate 210. Next, the plurality of second contacts 235, the plurality of third peripheral vias JV3, the second connection structure 230, the plurality of second pixel vias PV2, the plurality of second peripheral vias Jv2, the plurality of second pixel pads PP2, the plurality of second coupling suppression lines 260, the plurality of second peripheral pads JP2, the second interlayer insulating layer 220, and the second bonding layer 241 may be formed. Accordingly, the second preliminary structure PS2 may be completed.

Next, the second preliminary structure PS2 may be bonded to the first preliminary structure PS1. The first coupling suppression line 160 may contact the second coupling suppression line 260, the first pixel pad PP1 may contact the second pixel pad PP2, the first peripheral pad JP1 may contact the second peripheral pad JP2, and the first bonding layer 140 may contact the second bonding layer 241.

Figure 6C:
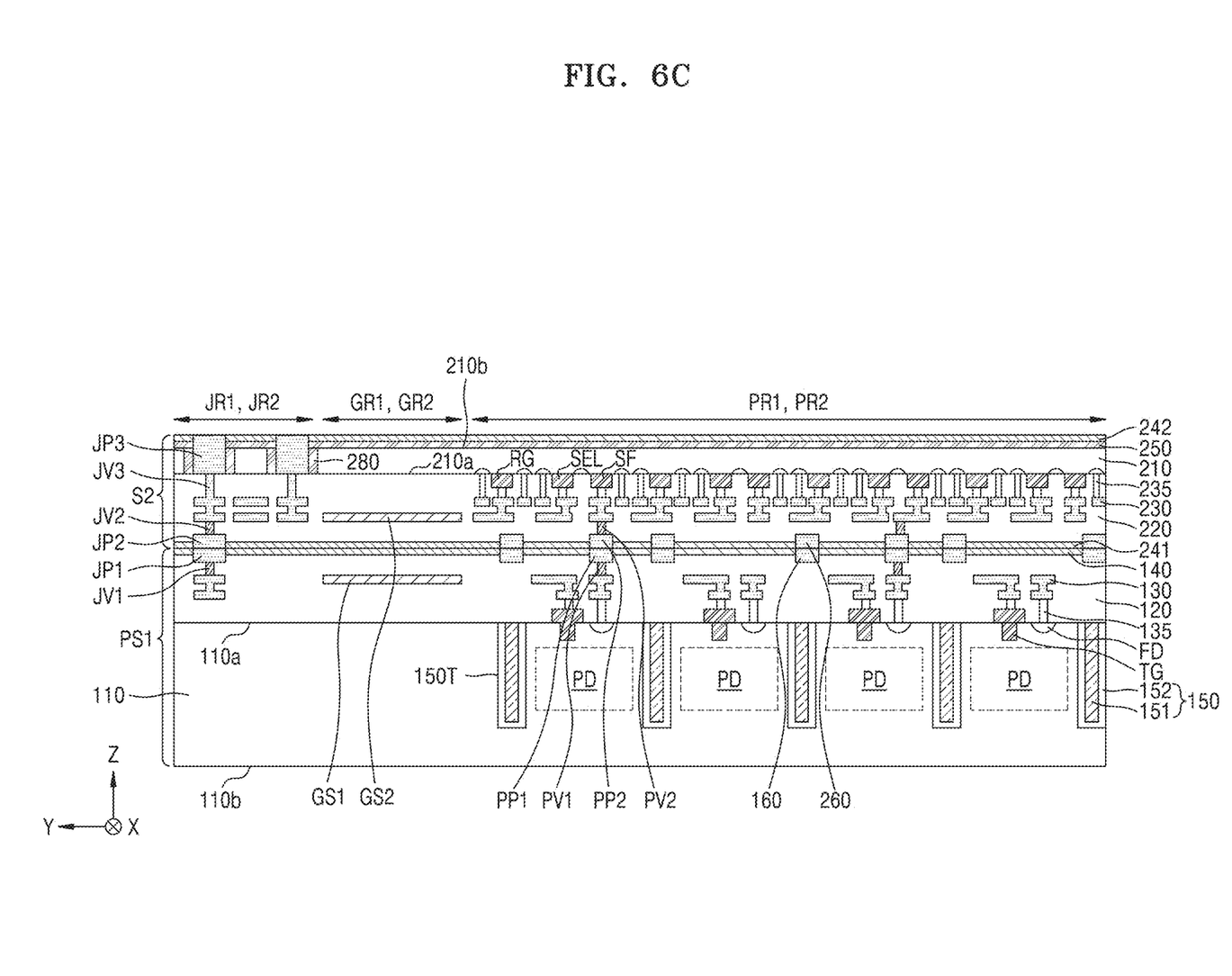

Referring to FIGS. 6B and 6C, the thickness of the second substrate 210 in the vertical direction (Z direction) may be reduced by polishing the second surface 210b of the second substrate 210. Next, the bonding insulating layer 250, the third bonding layer 242, the substrate insulating layer 280, and the plurality of third peripheral pads JP3 may be formed.

Figure 6D:
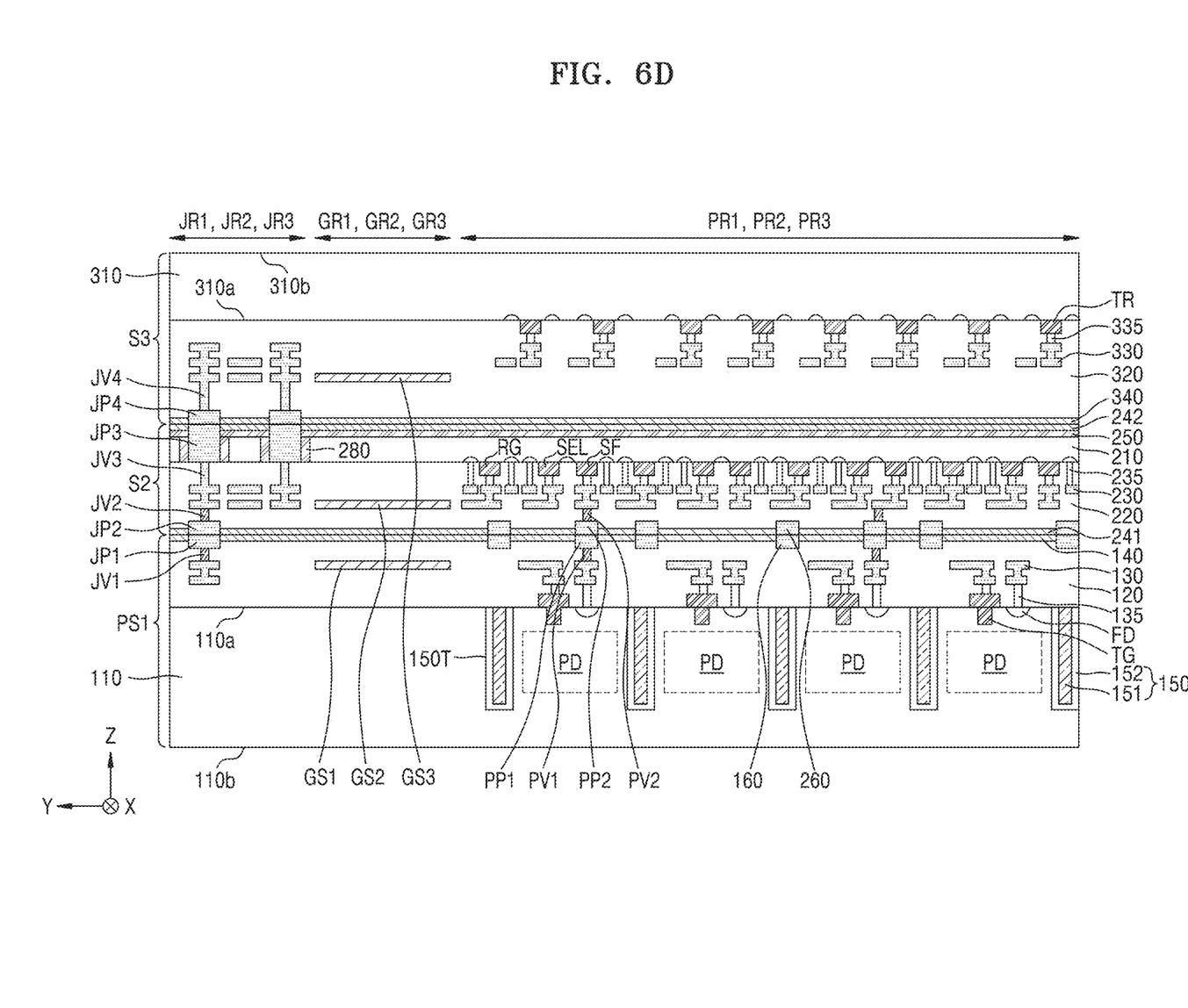

Referring to FIG. 6D, a third structure S3 may be prepared. First, the plurality of transistors TR may be formed on the third substrate 310. Next, the plurality of third contacts 335, the third connection structure 330, the plurality of fourth peripheral vias JV4, the plurality of fourth peripheral pads JP4, the third interlayer insulating layer 320, and the fourth bonding layer 340 may be formed.

Next, the third structure S3 may be bonded to the second preliminary structure PS2. The first pixel pad PP1 may contact the second pixel pad PP2, the third peripheral pad JP3 may contact the fourth peripheral pad JP4, and the third bonding layer 242 may contact the fourth bonding layer 340.

Referring to FIGS. 6D and 4, the second surface 110b of the first substrate 110 may be polished to expose the pixel separation conductive layer 151. The antireflection layer 461 on the second surface 110b of the first substrate 110, the fence 463 on the antireflection layer 461, the color filter 470 on the antireflection layer 461, the micro-lens 480 on the color filter 470, and the capping layer 490 on the micro-lens 480 may be formed. The image sensor 1000 may be completed according to the method described with reference to FIGS. 6A to 6D and 4.

While the inventive concepts have been particularly shown and described with reference to embodiments thereof, it will be understood that various changes in form and details may be made therein without departing from the spirit and scope of the following claims.

What is claimed is:

1. An image sensor comprising:
a first structure and a second structure stacked on the first structure in a vertical direction,
the first structure comprising
   a first substrate comprising a first pixel region and a first ground region surrounding the first pixel region;
   first and second photoelectric conversion units in the first pixel region;
   first and second floating diffusion regions in the first pixel region;
   a first interlayer insulating layer on the first substrate;
   a first ground structure in a part of the first interlayer insulating layer on the first ground region;
   first and second pixel pads located on a part of the first interlayer insulating layer of the first pixel region and electrically connected to the first and second floating diffusion regions, respectively; and
   a first coupling suppression line extending in a first horizontal direction on a part of the first interlayer insulating layer of the first pixel region and the first ground region, penetrating between the first and second pixel pads, and electrically connected to the first ground structure,
the second structure comprising
   a second substrate comprising a second pixel region and a second ground region surrounding the second pixel region;
   first and second source-follower gates on the second pixel region;
   a second interlayer insulating layer on the second substrate;
   a second ground structure in a part of the second interlayer insulating layer on the second ground region;
   third and fourth pixel pads located on a part of the second interlayer insulating layer of the second pixel region and electrically connected to the first and second source-follower gates, respectively; and
   a second coupling suppression line extending in the first horizontal direction on a part of the second interlayer insulating layer of the second pixel region and the second ground region, penetrating between the third and fourth pixel pads, and electrically connected to the second ground structure, and
   the first and second pixel pads contact the third and fourth pixel pads, respectively.

2. The image sensor of claim 1, wherein
the first structure further comprises a first ground via located in a part of the first interlayer insulating layer on the first ground region and electrically connecting the first coupling suppression line to the first ground structure, and
the second structure further comprises a second ground via located in a part of the second interlayer insulating layer on the second ground region and electrically connecting the second coupling suppression line to the second ground structure.

3. The image sensor of claim 1, wherein
the first structure further comprises a first ground line extending in a second horizontal direction on a part of the first interlayer insulating layer of the first ground region to intersect the first coupling suppression line, and electrically connected to the first ground structure, and
the second structure further comprises a second ground line extending in the second horizontal direction on a part of the second interlayer insulating layer of the second ground region to intersect the second coupling suppression line and electrically connected to the second ground structure.

4. The image sensor of claim 3, wherein the first ground line is in contact with the second ground line.

5. The image sensor of claim 3, wherein the first horizontal direction is perpendicular to the second horizontal direction.

6. The image sensor of claim 3, wherein
the first structure further comprises a first ground pad located at an intersection of the first ground line and the first coupling suppression line, and
the second structure further comprises a second ground pad located at an intersection of the second ground line and the second coupling suppression line.

7. The image sensor of claim 6, wherein
the first structure further comprises a first ground via extending in the vertical direction between the first ground pad and the first ground structure, and
the second structure further comprises a second ground via extending in the vertical direction between the second ground pad and the second ground structure.

8. The image sensor of claim 1, wherein the second structure further comprises a select gate on the second pixel region.

9. The image sensor of claim 1, wherein
the first structure further comprises a transfer gate on the first pixel region, and
the second structure further comprises a reset gate on the second pixel region.

10. The image sensor of claim 1, wherein, in a plan view,
the first ground structure surrounds a part of the first interlayer insulating layer on the first pixel region, and
the second ground structure surrounds a part of the second interlayer insulating layer on the second pixel region.

11. The image sensor of claim 1, wherein, in a plan view, each of the first ground structure and the second ground structure has a ring shape.

12. The image sensor of claim 11, wherein, in a plan view, each of the first ground structure and the second ground structure has a quadrangular ring shape.

13. The image sensor of claim 1, wherein the first coupling suppression line is in contact with the second coupling suppression line.

14. The image sensor of claim 1, wherein
the first substrate further comprises a first peripheral region surrounding the first ground region, the first structure further comprises a first peripheral pad on a part of the first interlayer insulating layer of the first peripheral region, the second substrate further comprises a second peripheral region surrounding the second ground region, and the second structure further comprises a second peripheral pad on a part of the second interlayer insulating layer of the second peripheral region.

15. The image sensor of claim 14, wherein the first peripheral pad is in contact with the second peripheral pad.

16. The image sensor of claim 14, further comprising a third structure on the second structure, the third structure comprising a third substrate comprises a third pixel region and a third peripheral region surrounding the third pixel region;

a transistor on the third pixel region;

a third interlayer insulating layer on the third substrate and the transistor;

a third peripheral pad located on a part of the third interlayer insulating layer of the third peripheral region and electrically connected to the transistor, the second structure further comprising a fourth peripheral pad penetrating the second peripheral region, and the third peripheral pad being in contact with the fourth peripheral pad.

17. The image sensor of claim 1, wherein one surface of the first coupling suppression line and one surface of the first pixel pad are coplanar, and one surface of the second coupling suppression line and one surface of the second pixel pad are coplanar.

18. The image sensor of claim 1, wherein the first structure further comprises first and second pixel vias electrically connecting the first and second pixel pads to the first and second floating diffusion regions, respectively, the second structure further comprises third and fourth pixel vias electrically connecting the third and fourth pixel pads to the first and second source-follower gates, respectively, the first pixel pad comprises a material different from a material of the first pixel via, the second pixel pad comprises a material different from a material of the second pixel via, the third pixel pad comprises a material different from a material of the third pixel via, and the fourth pixel pad comprises a material different from a material of the fourth pixel via.

19. An image sensor comprising:

a first substrate comprising a pixel region and a ground region surrounding the pixel region;

first and second photoelectric conversion units in the pixel region;

first and second floating diffusion regions in the pixel region;

a first interlayer insulating layer on the first substrate;

a ground structure in a part of the first interlayer insulating layer on the ground region;

first and second pixel pads located on a part of the first interlayer insulating layer of the pixel region and electrically connected to the first and second floating diffusion regions, respectively;

a first coupling suppression line extending in a horizontal direction on a part of the first interlayer insulating layer on the pixel region and the ground region, penetrating between the first and second pixel pads, and electrically connected to the ground structure;

third and fourth pixel pads contacting the first and second pixel pads, respectively;

a second coupling suppression line contacting the first coupling suppression line, extending in the horizontal direction, and penetrating between the third and fourth pixel pads;

a second interlayer insulating layer on the third and fourth pixel pads and the second coupling suppression line;

first and second source-follower gates located on the second interlayer insulating layer and electrically connected to the third and fourth pixel pads, respectively; and a second substrate on the second interlayer insulating layer.

20. An image sensor comprising:

a first structure and a second structure stacked on the first structure in a vertical direction, the first structure comprising a first substrate;

first and second photoelectric conversion units in the first substrate;

first and second floating diffusion regions in the first substrate;

a first interlayer insulating layer on the first substrate;

first and second pixel pads located on the first interlayer insulating layer and electrically connected to the first and second floating diffusion regions, respectively; and a first coupling suppression line extending in a first horizontal direction on the first interlayer insulating layer and penetrating between the first and second pixel pads;

the second structure comprising a second substrate comprising a pixel region and a ground region surrounding the pixel region;

first and second source-follower gates on the pixel region;

a second interlayer insulating layer on the second substrate;

a ground structure in a part of the second interlayer insulating layer on the ground region;

third and fourth pixel pads located on a part of the second interlayer insulating layer of the pixel region and electrically connected to the first and second source-follower gates, respectively; and a second coupling suppression line extending in a horizontal direction on a part of the second interlayer insulating layer on the pixel region and the ground region, penetrating between the third and fourth pixel pads, and electrically connected to the ground structure, the first and second pixel pads contact the third and fourth pixel pads, respectively, and the first coupling suppression line contacts the second coupling suppression line.

* * * * *